United States Patent

Ciraula et al.

[11] Patent Number: 5,301,165
[45] Date of Patent: Apr. 5, 1994

[54] CHIP SELECT SPEEDUP CIRCUIT FOR A MEMORY

[75] Inventors: Michael K. Ciraula, Manassas, Va.; Christopher M. Durham, Austin, Tex.; Derwin L. Jallice, Reston, Va.

[73] Assignee: International Business Machines Corporation, Armonk, N.Y.

[21] Appl. No.: 967,366

[22] Filed: Oct. 28, 1992

[51] Int. Cl.[5] .................................................. G11C 7/00
[52] U.S. Cl. ............................. 365/233.5; 365/230/06
[58] Field of Search .......... 365/233.5, 230.06, 230.08; 307/449

[56] References Cited

U.S. PATENT DOCUMENTS

| | | | |
|---|---|---|---|
| 4,614,883 | 9/1986 | Sood et al. | 307/449 |
| 4,630,239 | 12/1986 | Reed et al. | 365/233.5 |
| 4,636,991 | 1/1987 | Flannagan | 365/233.5 |
| 4,638,462 | 1/1987 | Rajeevakumar | 365/233.5 |
| 4,800,304 | 1/1989 | Takeuchi | 365/233.5 |
| 4,803,665 | 2/1989 | Kasa | 365/233.5 |
| 4,893,282 | 1/1990 | Wada et al. | 365/233.5 |
| 4,970,694 | 11/1990 | Tanaka et al. | 365/233 |
| 5,025,422 | 6/1991 | Moriwaki | 365/233.5 |

FOREIGN PATENT DOCUMENTS

| | | |
|---|---|---|
| 61-105795 | 5/1986 | Japan . |
| 63-200392 | 8/1988 | Japan . |
| 2-152096 | 6/1990 | Japan . |

OTHER PUBLICATIONS

Technical Disclosure Bulletin, vol. 31, No. 5, Oct. 1988, pp. 335-336.

Primary Examiner—Eugene R. LaRoche
Assistant Examiner—A. Zarabian
Attorney, Agent, or Firm—Mark A. Wurm

[57] ABSTRACT

A memory circuit is provided which has a select and a deselect mode. The memory circuit, as part of its technique for quickly accessing data, includes circuitry for generating a pulse in response to detecting an address transition. When the memory circuit switches from the deselect mode to select mode, there appears to be an address transition even when there is not an address transition. In order to prevent a delay associated with interpreting such a false transition as an actual transition, local clock pulse generators are used which only detect high to low transitions in the chip select mode.

6 Claims, 5 Drawing Sheets

CHIP SELECT SPEEDUP CIRCUIT FOR A MEMORY

This invention was made with Government support under contract number F29601-89-C-0016, awarded by the Department of the Air Force. The Government has certain rights in this invention.

BACKGROUND OF THE INVENTION

1. Technical Field

The present invention relates to memories which have a chip select function, and more particularly, to asynchronous memories which have the chip select function and which utilize address transition detection.

2. Background Art

A chip select function has long been used in memories to disable a memory chip to reduce power consumption. The memory is not responsive to external address signals when deselected by the chip select signal. While there is a power savings, there is also the potential problem of a loss of speed when switching from the deselected mode to the chip selected mode because the circuitry is powered down and there is a necessary recovery time. It is desirable to disable the input stage of as many input signals as is feasible during the deselect mode. In many modern memories, however, address transition is used for equilibrating bit lines as well as for other functions, for the purpose of increasing the speed of operations which is reflected in lower access times. When an access address buffer which receives an external address signal receives a logic low input, the transition from the deselect to select mode will cause the buffer to provide an address transition which is detected as such if the buffer is disabled during the deselect mode. There is then an unnecessary equalization pulse generated as a consequence of the address buffer being disabled during the deselect mode. There is, however, a delay in generating the equalization pulse. The delay is in enabling the address buffer because of an unavoidable delay in responding to the chip select signal. This causes a longer access time for the case in which the memory chip is coming out of the chip select mode than for the case for an address transition during the select mode. The alternative to having the extended access time has been either to not disable the address buffers during the deselect mode and incur the additional power loss, or to put "masking" circuitry in the chip select access path to disable the address transition pulse during the chip select mode of operation.

In asynchronous static random access memories (SRAMs), no external clock signals are provided. This requires an internally generated clock to provide the timing signals for the chip to operate. The clock signals are produced when an input to the RAM (i.e., an address signal) transitions, implying that some externally connected device, such as a microprocessor, desires the chip to perform either a read or write operation based on new input information. However, an SRAM chip also has another input known as a chip select which places the device either in the active addressable state or in an inactive standby state.

Access delay penalties are paid when the asynchronous SRAM comes out of the standby state into the addressable state. If the device generates a clock pulse, then the delay to activate the chip by transitioning to the chip select mode is added to the standard addressable access time.

OBJECTS OF THE INVENTION

An object of the present invention is to provide an improved chip select operation for a memory.

Another object of the invention is to provide an improved memory which utilizes address transition detection and which has a chip select operation.

A further object of the invention is to provide an improved technique for transferring a memory from a deselect to a select mode so that this can happen faster than an address transition access time.

SUMMARY OF THE INVENTION

These and other objects are achieved in a memory circuit which is enabled in response to an occurrence of a chip select signal which comprises a falling edge address transition detection pulse generator. Local pulse generators detect only high to low transitions in the chip select circuitry. Also, during the deselected mode, internal address signals (true and complement) are held at a logic low and the chip is placed in the precharge/equilibrate state. Consequently, no pulse is generated (or required) for chip select access and, therefore, the additional delay usually encountered for the address pulse generation is removed. The result is a chip select access much faster than the address (transition detection) access.

DISCUSSION OF THE PREFERRED EMBODIMENT

To eliminate the access penalty between chip select and address transition detection, many asynchronous SRAM chip designs provide additional circuitry that mask the address generated clock pulse when the chip is activated via the chip select. However, the vast majority of asynchronous SRAMs accept the access penalty and make no modifications to try to equalize the two access times. The present invention discloses new circuitry that prevents the additional access time penalty of a chip select by suppressing the clock pulse generation in a method superior to known designs.

Three typical prior SRAM designs dealing with chip select access penalty are discussed. A first method discloses a chip select speed up known as chip select masking pulse. A second method is known as chip select delay masking. A third method is where no pulse masking is performed and the additional time delay is accepted. Each method has its own advantages and disadvantages as detailed in the discussion of each.

Figure 1:
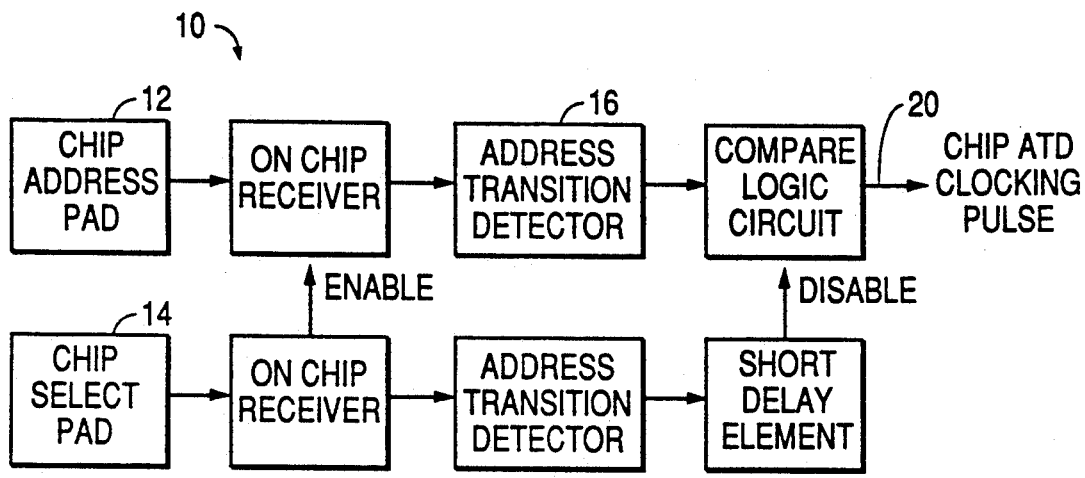
FIG. 1 a block diagram of a chip select masking pulse circuit.

Shown in FIG. 1 is a block diagram of the chip select masking pulse circuitry of the prior art. In the chip select masking pulse circuitry 10, a clock pulse generator is placed on both the chip address pad 12 and the chip select pad 14. In the standard mode of operation, the clocking pulses are generated from the changing SRAM address input. But in the chip select mode of operation, clock pulses are generated from the address and from the chip selection, also. The chip select pulse is delayed to match any address pulse delay and both are sent to a compare logic circuit 16. The compare circuit 16 allows the address generated pulse 20 if the chip select pulse does not exist. If the select pulse does exist, then neither pulse is allowed to propagate to the chip. This way the chip clocking pulse is only active in the standard mode of operation. Thus, the clocking is deactivated when the chip is in the power up mode reducing the access time.

Figure 2:
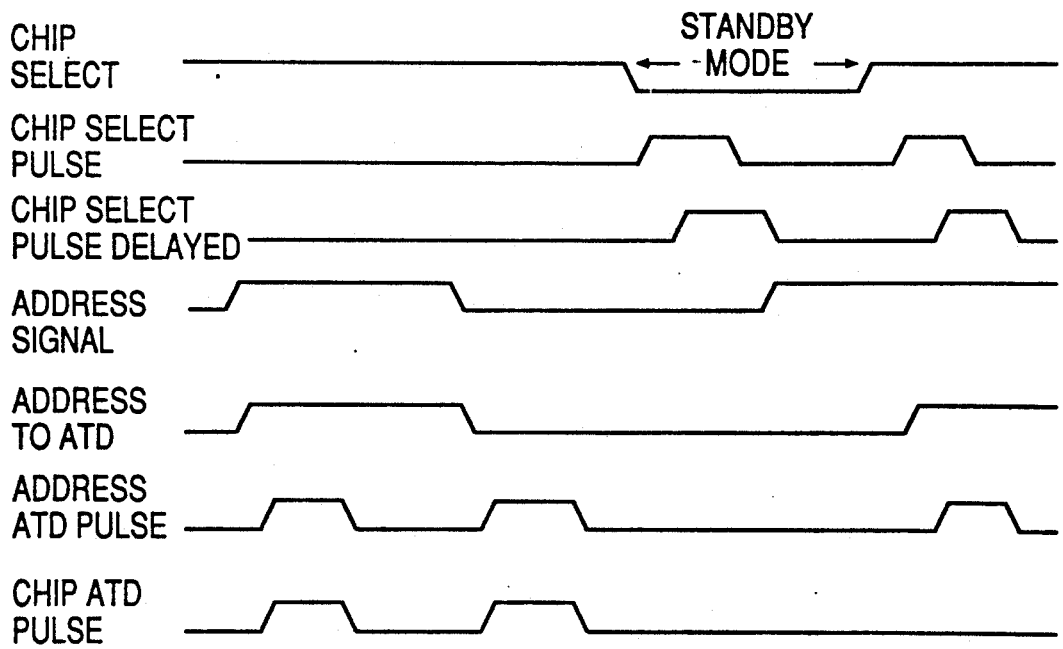
FIG. 2 is a chip select masking pulse timing diagram.

The address transition detection (ATD) pulse generation and timing for this circuitry is shown in FIG. 2. The chip access time is not increased in the chip select mode and pulse masking is relatively simple once the signals are generated. Since the chip select pulse must arrive at the compare circuit before the address pulse, there is a possible race condition which may be difficult to control. The chip select pulse must track to each address pulse regardless of skewing due to chip loading. Because of the spread of the address receivers and individual pulse generators across the entire chip, tracking the chip select pulse to the address pulse may difficult. Improper timing can potentially cause a valid address ATD pulse to be missed entirely. As a result, data errors on a SRAM could occur because the SRAM would not have been set up for the next memory address. This is potentially a catastrophic error because of invalid data.

Figure 3:
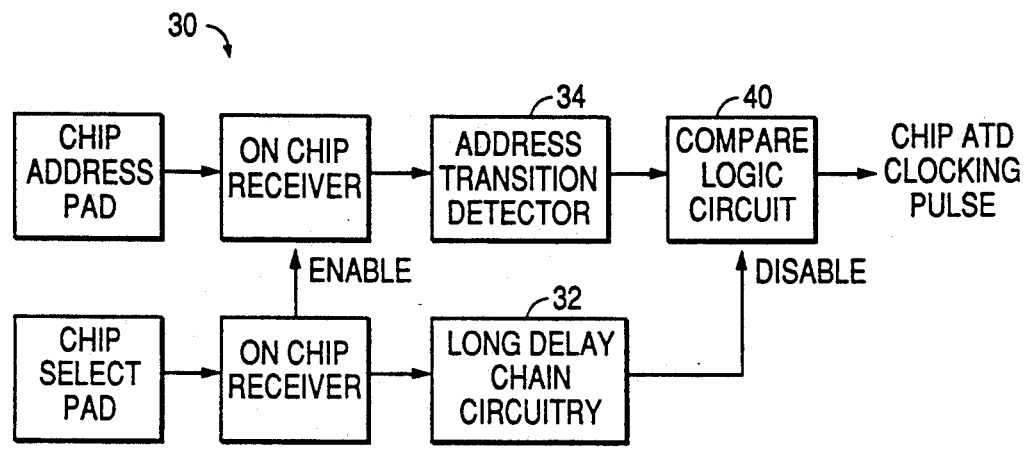
FIG. 3 is a chip select delay masking block diagram.

A block diagram of a chip select delay masking prior art circuit for chip select speed up in shown in FIG. 3. The circuit 30 has clock pulse generators placed only on the address inputs. On the chip select path, a long delay circuit 32 is used instead of a pulse generator. In the standard mode of operation, the clock impulses are generated from the changing address input, however, in the chip select mode of operation, clock pulses are only generated from the address transition detector 34. The chip select signals are delayed from a period longer than the address pulse, plus delay, plus margin. Both signals then appear at the input of a compare circuit 40. The compare circuit 40 allows the address pulse to pass through to the chip if the chip select signal is active.

If the chip select signal is not propagated through the delay to the compare circuit 40, then the pulse is not allowed to continue. In this way, the chip clocking pulses is only active in the standard mode of operation. Thus, the clocking pulses is deactivated when the chip is in the power up mode, reducing the access time.

Figure 4:
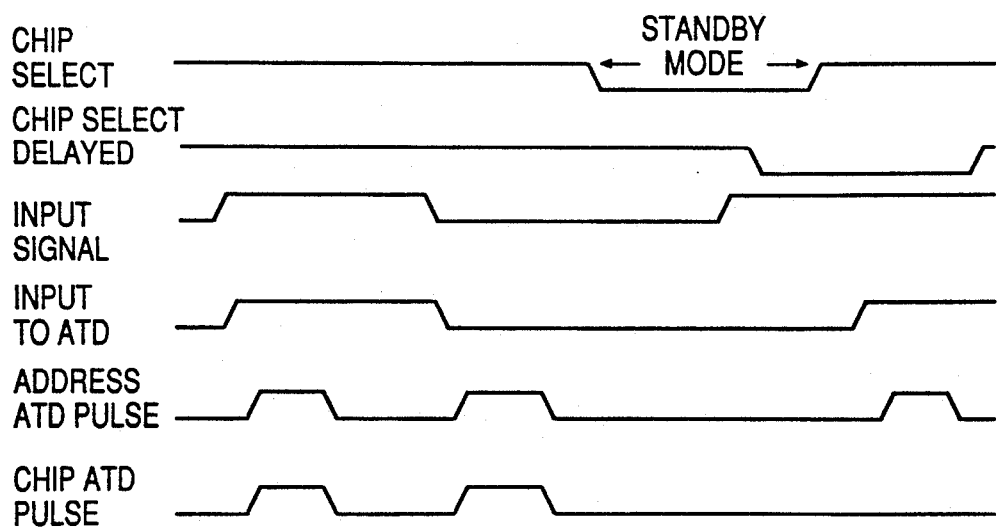
FIG. 4 is a chip select delay masking timing diagram.

A showing of the ATD pulse generation and timing for the circuitry of the chip select delay masking 30 is shown in FIG. 4. Chip access time is not increased in chip select mode. Pulse masking is relatively simple, once the signals are generated. A disadvantage is that the chip select signal in the power up mode must arrive at the compare circuit after the address pulse. This raises the possibility of race conditions which may difficult to control, so the chip select signal controls much of the chip. The chip select delay circuit must track to each address pulse regardless of skewing due to loading.

Again, this not trivial to obtain due to the spread of the address receivers and individual pulse generators across the entire chip. The delay circuit of chip select will also defeat the address when a chip is powered down. This may be undesirable since a pulse may be desired to reset the device when powered down.

Figure 5:
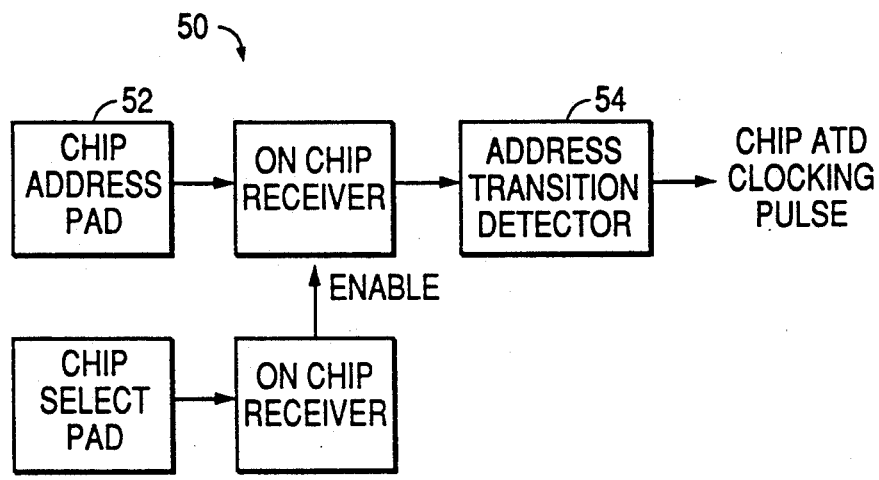
FIG. 5 is a block diagram of a no pulse masking circuit.

Shown in FIG. 5 is a block diagram of a no pulse masking circuitry, known in the art. In the no pulse masking circuit 50, clocking pulse generators are placed on the address inputs 52. However, no clocking is placed on the chip select signal. In a standard mode of operation, the clocking pulses are generated from a changing address input, however, in the chip select mode of operation, clock pulses are still only generated from the address transition detectors 54. The chip select signal is not delayed nor is a pulse propagated from the chip select signal. Consequently, no compare circuit is required regardless of the operational mode, standard or power up/down. The address pulse is propagated to the entire chip. In this way, the chip clocking pulse is always active in either the chip select or in the standard mode.

Figure 6:
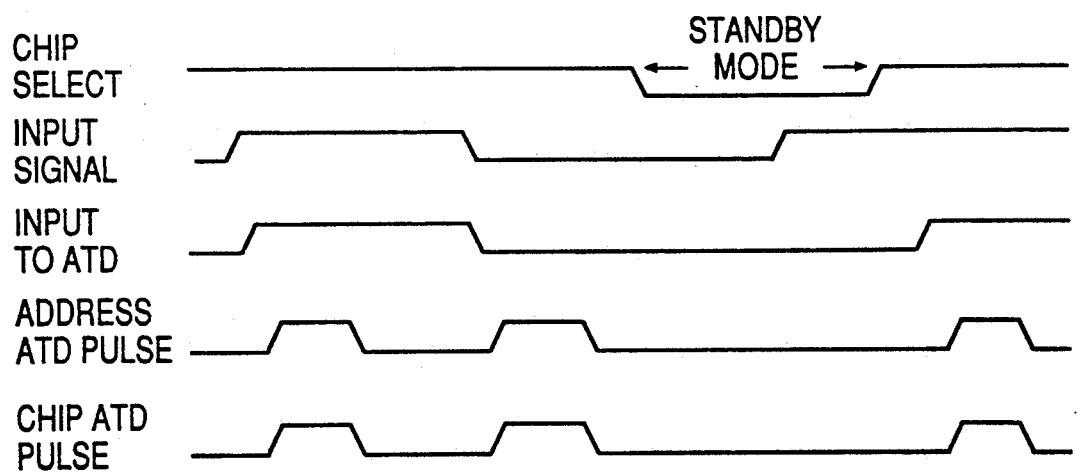
FIG. 6 is a timing diagram with a no pulse masking circuit.

The ATD pulse generation and timing for the no pulse masking circuitry is shown in FIG. 6. This design is extremely simple, requires very little thought and has no race condition. The circuitry required is reduced to the minimum of size and gate count. The disadvantages of this type of design are the that the pulse signal is propagated regardless of the mode of operation. Consequently, the circuit does not speed up the the chip select access time. Therefore, an additional delay from the chip select circuitry to the time the address receivers are enabled, is added to the chip access time.

Figure 7:
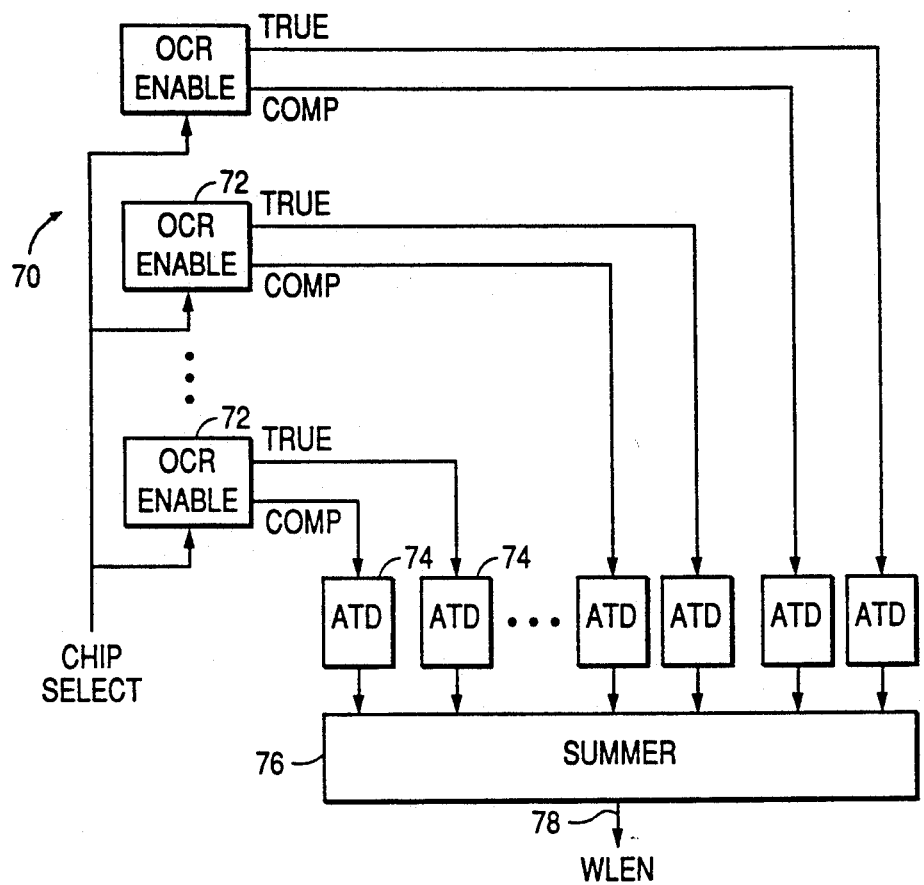
FIG. 7 is a block diagram of a circuit of the present invention.

To solve the problems of the prior art, the circuit of the present invention, shown in FIG. 7, is proposed. The circuit 70 consists of on-chip receivers (OCRs) 72 having both true and complement outputs. The output of the OCRs 72 are used as inputs to address transition detectors (ATDs) 74. The outputs of the ATDs are combined in a summer 76 whose output is used as a write line enable 78.

When the chip select is high, both of the outputs of an OCR are low. The local pulse generators detect only high to low transitions in the chip select signal. Thus, no pulse is generated on a chip select access, but a pulse is generated upon a power down. Shown in FIG. 8 is a chip address pad 82 and a chip select pad 84, on-chip receivers 86, falling edge ATD pulse generator 74 for both the true and the complement output of the OCR summer 88 whose output is used initiating a local ATD clocking pulse 90.

Figure 8:
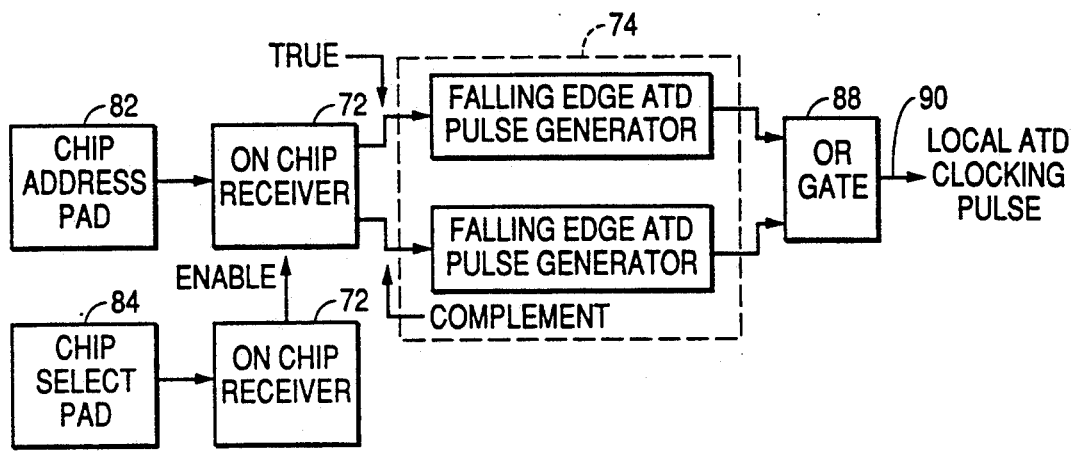
FIG. 8 is a block diagram of a local address transition detection circuit.
Figure 9:
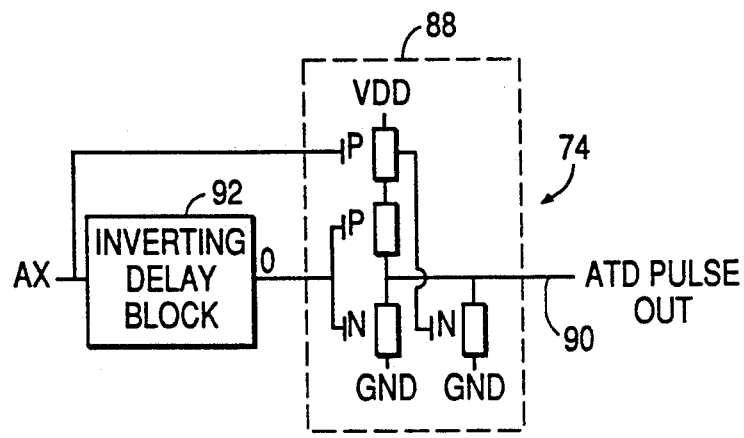
FIG. 9 is diagram of a falling edge detect transition detection pulse generator.

The falling edge ATD pulse generator 74 of FIG. 8 is shown in more detail in FIG. 9. The falling edge ATD pulse generator 74 is made up of an inverting delay block 92 and OR gate 88. The inverting delay block 92 can be, for example, made up of three inverters so that the signal input into the inverting block is delayed by a time sufficient to insure that only transitions from a high to low cause a chip select transition to be sent out as an ATD pulse.

Figure 10:
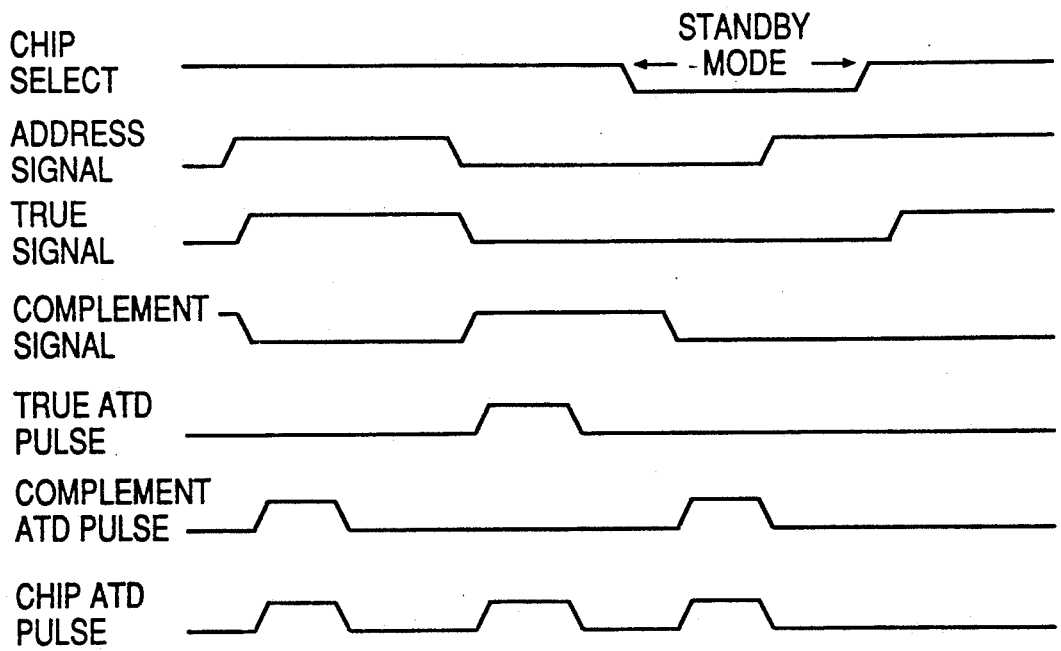
FIG. 10 is a timing diagram of the chip select speed up according to the present invention.

The timing diagram for the present invention is shown in FIG. 10. In the standard mode of operation, the circuit operates with an address access time controlled by the ATD detection circuit. That is, when the chip select is active, the ATD pulse is generated any time one or more of the SRAMs address signal change. This is so, because, the output signals of the receiver, both true and complement, being mutually exclusive, are always high/low or low/high prior to switching. When input switches, then the outputs must either go low/high or high/low providing a low to high switching input to one of the falling edge ATD pulse generators 74. Therefore, the OR gate 88 produces a normal ATD pulse. Thus, the new design does not affect the mode of operation where the chip select in enabled. This can be seen in operation as the left-hand portion of FIG. 10.

However, when the chip is in the power down/up mode, the circuit of the present invention operates quite differently. In the power down operation, the on-chip receiver circuit is designed such that the address signals are forced to a low state. Therefore, either the true or complement output must transition low or fall when the chip select is turned off. Since either the true or complement falling edge ATD pulse generator will see the falling edge, an ATD pulse is generated. However, this pulse does not affect operation when the chip is already in the standby mode by virtue of the chip select being off. This operation can be seen in the middle section of FIG. 10.

In the power up operation, when the chip select now transitions back to on, the outputs of the on-chip receiver are now activated after the delay of the chip select circuitry. Since both outputs were low in the power down state, the only possible power up transition for the true/compliment signal pair is low/high and low/low or low/low and low/high. Thus, neither of the falling edge ATD pulse generators will see a falling edge. Consequently, no chip ATD pulse will be generated. The ATD is suppressed or masked without either a chip select pulse generator, as shown in the prior art or by a chip select delay circuit, also known in the art. The operation of the present invention can be seen in the right-hand portion of FIG. 10.

Advantages of the new design are that the chip select access time is not increased in the chip select mode of operation. This is because the ATD pulse is not generated during power up. Pulse masking is automatic because the falling edge ATD pulse generator as part of the local ATD circuitry. No pulses or signals must align at a compare stage and therefore, there are no race conditions possible. The present design eliminates the chip select pulse generator, delay circuit and compare steps. No signal skew problems are encountered due to temperature effects, process variations, power supply degradation or other skew causing factors. The ATD pulse is not defeated during power down. The signal is still generated and may be used as a signal for some circuit features. The circuitry required is relatively simple, there being no complex interaction between the circuit components.

A disadvantage to the new design is slightly increased circuit area. On a 256K radiation hardened SRAM design, the technique uses approximately 30% more area for the clocking circuitry than the no masking design of the prior art and 20% more area than other types. This must be viewed in perspective, since the clocking generation circuitry on a SRAM consumes less than 1% of the total area of the chip, a 30% increase of the clocking circuit area corresponds to a 0.15 increase in the total circuit area.

The new circuit for speeding up the chip select access time for asynchronous SRAM devices has been disclosed. The new circuit combines all the features of SRAM prior art while eliminating the disadvantages. The cost of the new circuit is minimal, only requiring a slight area increase in clock generation circuitry.

What is claimed is:

1. A memory circuit which is enabled in response to an occurrence of a chip select signal, comprising:
    a plurality of address input means, each for receiving an address signal and being enabled in response to an occurrence of a chip select signal;
    transition detection means coupled to the plurality of address input means, for detecting transition of an address signal: and
    signal pulse generation means for producing a clock pulse in response to an address transition, the pulse generated only on detection of a falling edge of the address transition signal.

2. A memory circuit which, in response to a chip select signal switching from a first logic state to a second logic state, provides data selected by a plurality of address signals, comprising:
    a plurality of address input means enabled by the second logic state of the chip select signal and disabled by the first logic state of the chip select signal, each address input means for receiving a corresponding address signal, for providing an output signal representative of the received address signal when enabled by the chip select signal, and for providing the output signal in a predetermined state when disabled by the select signal:
    a plurality of transition detection means, each coupled to a corresponding address input means for detecting a transition of the output signal of the corresponding address input means: and
    disabling means for disabling all of the transition detection means until a falling edge signal from the address transition detectors is obtained.

3. In a memory circuit which is enabled in response to an occurrence of a chip select signal, and which comprises:
    input means for receiving an address signal and providing an output responsive thereto when enabled by an occurrence of the chip select signal, and providing the output at a predetermined state when disabled by the chip select signal:
    transition detection means, coupled to the input means for detecting a transition of the address signal: and
    an equalization pulse generator means, coupled to the transition detection means, for generating an equalization pulse in response to the transition detection means detecting a transition of the address signal:
    a method comprising the steps of:
    preventing the detection means from detecting a transition of the address signal because there is no leading edge transition to the detected address transition signal.

4. The memory circuit of claim 2, wherein the chip select signal has both true and complement logic values.

5. The circuit of claim 2, wherein the plurality of address input means are summed in a OR gate.

6. The memory circuit of claim 2, wherein the output of the transition detection means is combined in a summer whose output is used as a write line enable for the memory circuit.

* * * * *